US011449377B2

(12) United States Patent
Huang et al.

(10) Patent No.: US 11,449,377 B2
(45) Date of Patent: Sep. 20, 2022

(54) ADAPTIVE FREQUENCY CONTROL FOR HIGH-SPEED MEMORY DEVICES

(71) Applicant: MICRON TECHNOLOGY, INC., Boise, ID (US)

(72) Inventors: Jian Huang, Union City, CA (US); Zhenming Zhou, San Jose, CA (US); Zhongguang Xu, San Jose, CA (US); Murong Lang, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/996,267

(22) Filed: Aug. 18, 2020

(65) Prior Publication Data

US 2022/0058070 A1 Feb. 24, 2022

(51) Int. Cl.
*G06F 11/00* (2006.01)
*G06F 11/07* (2006.01)
*G11C 16/26* (2006.01)
*G06F 11/10* (2006.01)
*G11C 16/04* (2006.01)

(52) U.S. Cl.
CPC ........ *G06F 11/076* (2013.01); *G06F 11/0727* (2013.01); *G06F 11/1068* (2013.01); *G11C 16/26* (2013.01); *G11C 16/0483* (2013.01)

(58) Field of Classification Search
CPC ............... G06F 11/076; G06F 11/0727; G06F 11/1068; G06F 11/0754; G06F 11/073; G06F 11/1064
See application file for complete search history.

(56) References Cited

U.S. PATENT DOCUMENTS

| 9,257,199 | B2 * | 2/2016 | Schreiber | ............. | G11C 29/021 |
| 2014/0281819 | A1 * | 9/2014 | Wood | .................. | G06F 11/1048 714/773 |
| 2019/0129818 | A1 * | 5/2019 | Kannan | ................ | G11C 29/022 |

\* cited by examiner

*Primary Examiner* — Katherine Lin
(74) *Attorney, Agent, or Firm* — Lowenstein Sandler LLP

(57) ABSTRACT

A command to read specific data stored at a memory die is received. A read operation is performed while operating both a memory controller and the memory die simultaneously at a first frequency. A processor determines whether a first error rate associated with the memory die satisfies a first error threshold criterion (e.g., UECC). Responsive to determining that the first error rate satisfies the first error threshold criterion, the read operation is repeated while operating at least one of the memory controller or the memory die at a second frequency that is different from the first frequency. The processor determines whether a second error rate associated with the memory die satisfies a second error threshold criterion. Responsive to determining that the second error rate satisfies the second error threshold criterion (e.g. UECC persists), determining that the read operation has failed.

15 Claims, 5 Drawing Sheets

US 11,449,377 B2

ADAPTIVE FREQUENCY CONTROL FOR HIGH-SPEED MEMORY DEVICES

TECHNICAL FIELD

Embodiments of the present disclosure relate generally to a memory sub-system, and more specifically, relate to adaptively correcting frequency mismatch between a memory controller and memory devices in the memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
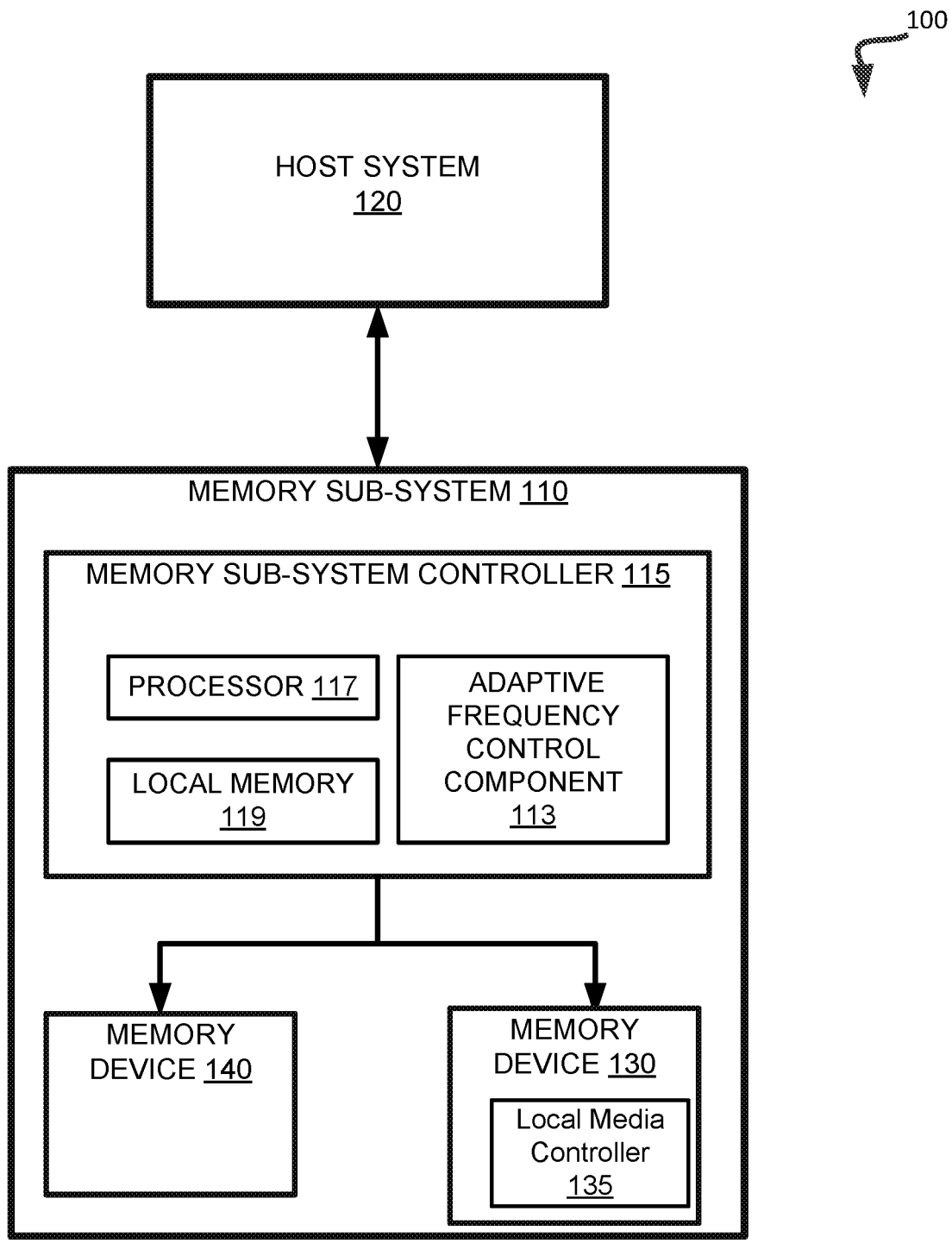
FIG. 1 illustrates an example computing system that includes a host system coupled with a memory sub-system in accordance with some embodiments of the present disclosure.

Aspects of the present disclosure are directed to adaptively correcting frequency mismatch between a memory controller and memory devices in the memory sub-system during operational lifetime of the memory sub-system. Additional aspects of the present disclosure are directed to pre-screening of memory dies before assembling the dies in memory devices based on reliability check of the memory dies after subjecting the dies to frequency-based defect screening in a test setup. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative- and (NAND) memory device. Another example is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines (BL)) and rows (also hereinafter referred to as wordlines (WL)). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A 3D cross-point based memory device (along with its controller) is referred to as a "drive", which has multiple dies layered in multiple planes known as "decks" in the memory device.

Advanced memory devices, such as 3D cross-point based memory devices, run at an extremely high speed with very tight timing margins. Timing margin in integrated circuits (ICs) is the difference between the time of an arrival of a signal to a circuit and the latest time by which the signal can arrive for the circuit to function correctly. Due to process variation during manufacturing, different dies can have slightly different timing margins. Moreover, the signal or power of an assembled memory device has fluctuation in drive voltage level, which aggravates the variation in timing margin between dies. If the timing margin becomes negative for a segment of the memory device, while a controller in a memory sub-system drives the segment of the memory device at a high frequency, the memory device cannot operate normally, and results in a write/read failure beyond the capability of the error correcting code (ECC) to correct the data. The memory sub-system then reports the occurrence of an uncorrectable error correcting code (UECC) event.

Conventional systems do not have any capability to solve UECC caused by loss of timing margin. Aspects of the present disclosure address the above and other deficiencies by addressing mismatch of frequency between a memory controller and memory dies that can result in UECC during high-speed operations and adaptively correcting that frequency mismatch. The method is also modified to set frequency-based test criteria for screening bad dies (with unacceptably low or even negative timing margins) at the factory level before assembling a drive.

Advantages of the present disclosure include, but are not limited to, adaptively adjust frequency mismatch between a memory controller and memory dies during different stages of the memory device's life, such as a tool for pre-screening dies at the factory, dynamic adjustment during read/write operations, and semi-permanent or permanent adjustment to account for variation in wear level during the operational lifetime of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Note that in this disclosure, a reliability test setup mimics the memory sub-system 110.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative- and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 115. In the illustrated example, the local memory 115 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 115 can include memory registers storing memory pointers, fetched data, etc. The local memory 115 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA) namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can additionally include an adaptive frequency control component 113 that can be used to facilitate the operations for the memory devices 130. The operations include transferring data from a host to the memory device during the write cycles, and transferring data from the memory device to the host for the read cycles. Specifically, in some embodiments, the adaptive frequency control component 113 shown in FIG. 1 can be part of an assembled memory sub-system 110 capable of dynamically control operating frequency of the memory controller and/or specific memory dies during the operational lifetime. In some other embodiments, the adaptive frequency control component 113 can be a part of a test setup that pre-screens specific dies in the factory before assembling the dies into a memory device. In some embodiments, the memory sub-system controller 115 includes at least a portion of adaptive frequency control component 113. For example, the memory sub-system controller 115 can include a processor 117 (processing device) configured to execute instructions stored in local memory 115 for performing the operations described herein. In some embodiments, adaptive frequency control component 113 is part of the host system 110, an application, or an operating system. In other embodiment, local media controller 135 includes at least a portion of adaptive frequency control component 113 and is configured to perform the functionality described herein. Further details with regards to the operations of the adaptive frequency control component 113 are described below.

Figure 2:
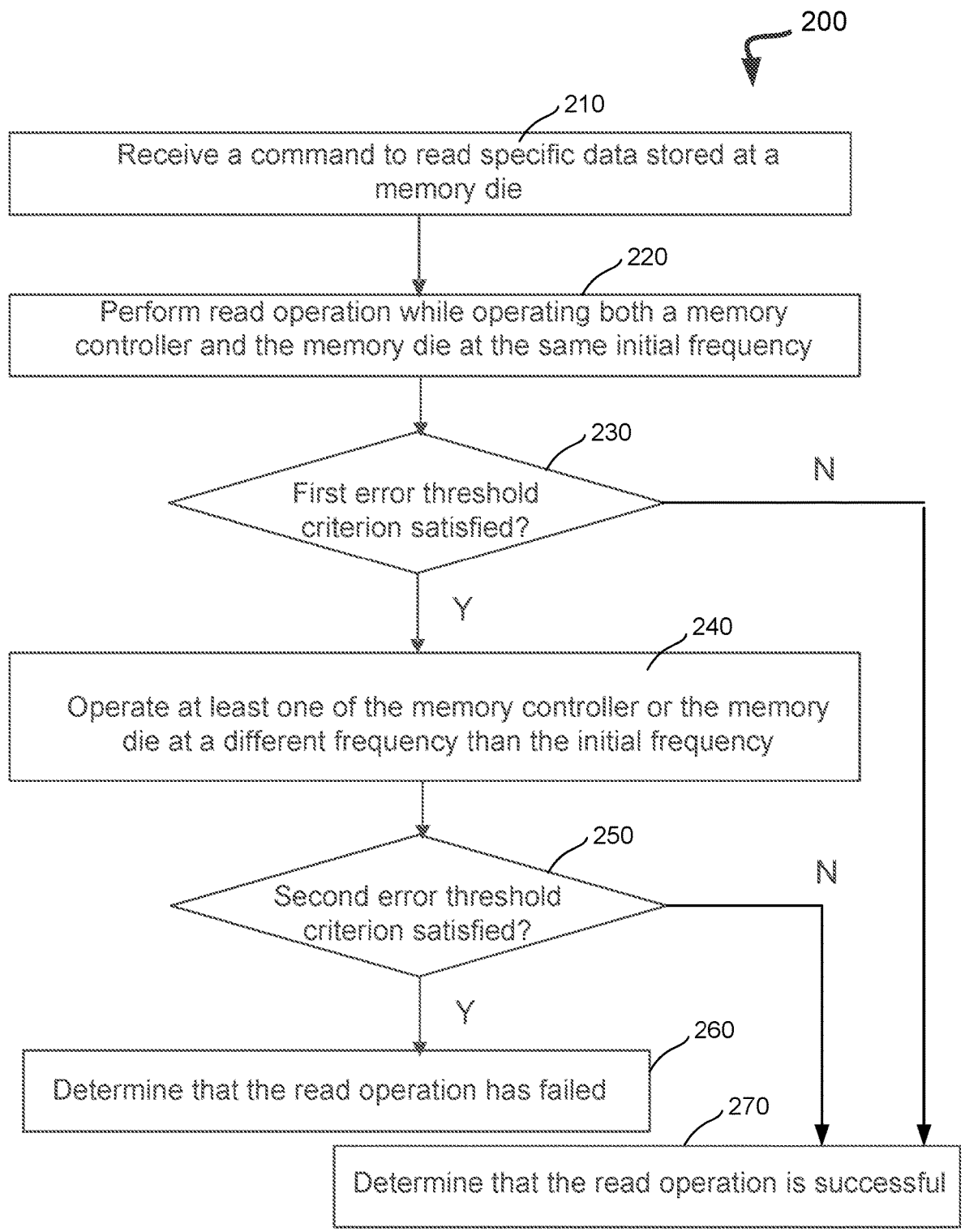
FIG. 2 illustrates a flow diagram of an example method of data recovery by dynamically reducing frequency mismatch between a memory controller and/or a memory die after the occurrence of an error event during the operational lifetime of a memory device, in accordance with some embodiments of the present disclosure.

FIG. 2 is a flow diagram of an example method 200 of data recovery by dynamically reducing frequency mismatch between a memory controller and a memory die after the occurrence of an error event during the lifetime of a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 can be performed by adaptive frequency control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. Moreover, though the operations are shown with respect to a read command, similar operations can be performed for write commands too.

At operation 210, a processor receives a command to read specific data stored at a specific location in a memory die. The specific data can be a target codeword (CW) or any other unit of stored data. At operation 220, the processor performs the read operation while operating the memory controller and the memory die at an initial frequency. This initial frequency can be based on device specification data available from factory tests on similar memory dies.

At operation 230, the processor determines whether a first error rate associated with the memory die satisfies a first error threshold criterion. In some embodiments, satisfying the first error threshold criterion can be determining that the error rate has exceeded a value where the ECC cannot correct the error, i.e. the error has become uncorrectable. This is referred to as an UECC event. The UECC can be related to tight timing margin of memory dies.

If the first error threshold criterion is not satisfied at operation 230, then at operation 270, the processor determines that the read operation is successful, and no further data recovery operation is necessary.

On the other hand, responsive to determining that the first error rate satisfies the first error threshold criterion, the processor proceeds to operation 240, and repeats the read operation while operating at least one of the memory controller or the memory die at a second frequency that is different from the initial frequency. For example, the processor can slow down the controller frequency while keeping the die frequency at the initial level, or, increase the die frequency while keeping the controller frequency at the initial level. In certain other embodiments, both the controller frequency and the die frequency are changed with respect to the initial frequency. This frequency adjustment is done to re-perform the failure event in order to confirm that the UECC is indeed related to poor timing margin of certain dies.

At operation 250, the processor determines whether a second error rate associated with the memory die satisfies a second error threshold criterion. Note that the first error threshold criterion and the second error threshold criterion can be similar, e.g., satisfying the second error threshold criterion can be occurrence of an UECC event.

If the second error threshold criterion is not satisfied at operation 250, then at operation 270, the processor determines that the data has been successfully recovered by adjusting the operating frequency of the memory controller and/or the memory die, and the read operation is successful.

On the other hand, responsive to determining that the second error rate satisfies the second error threshold criterion (e.g., UECC persists), at operation 260, the processor determines that the read operation has failed. Note that the memory sub-system can be configured to repeat operations 240 and 250 a predetermined number of times before declaring the read operation a success or a failure.

Figure 3:
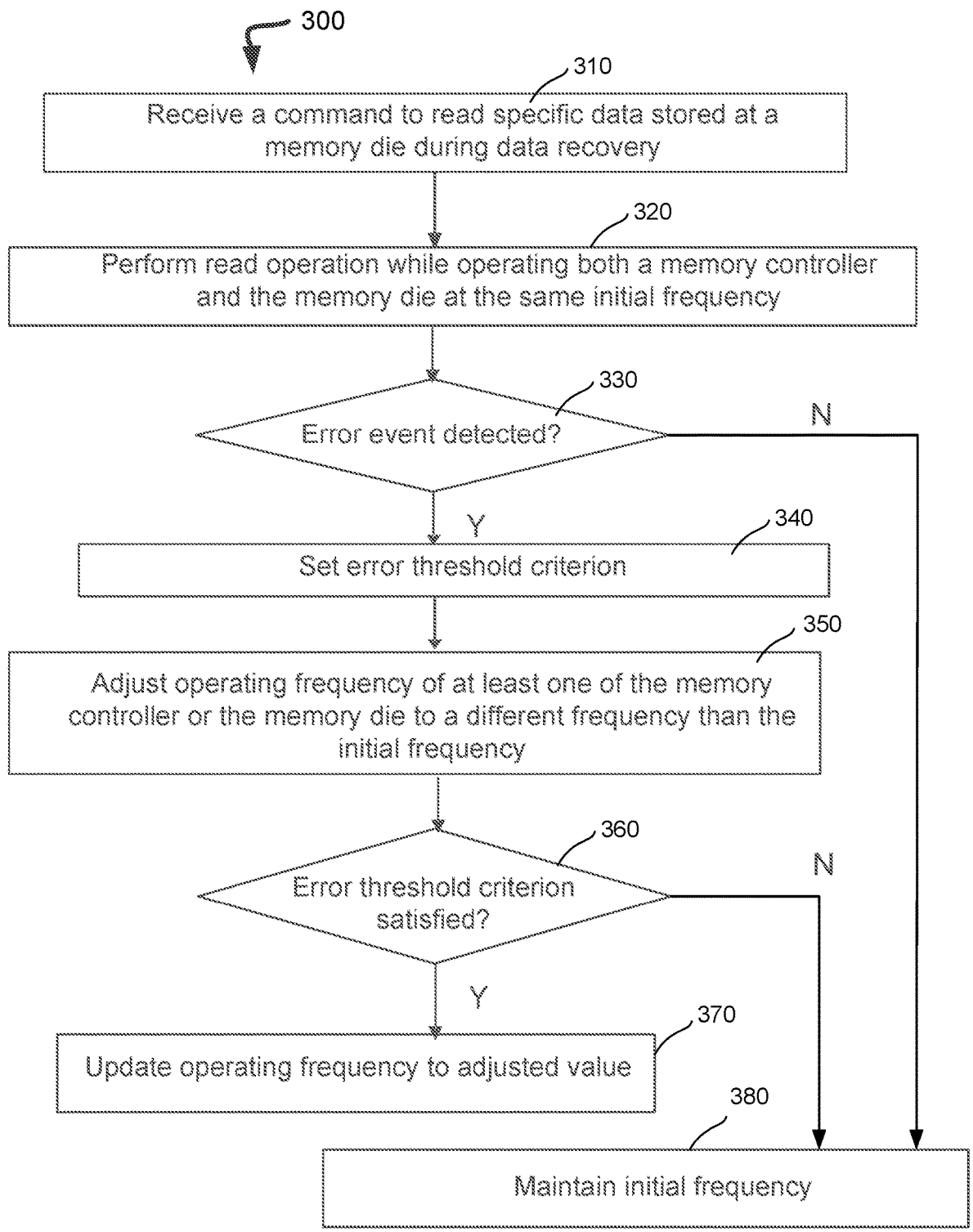
FIG. 3 illustrates a flow diagram of an example method of updating the operating frequency of the memory controller and/or the memory die on a semi-permanent or permanent basis after a predetermined number of recovery attempts, in accordance with some embodiments of the present disclosure.

FIG. 3 is a flow diagram of an example method 300 of updating the operating frequency of the memory controller and/or the memory die semi-permanently or permanently after a predetermined number of recovery attempts, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 can be performed by adaptive frequency control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a processor receives a command to read specific data stored at a specific location in a memory die. This operation can be similar or identical to operation 210 in method 200, though operation 310 can occur once the processor formally enters a data recovery flow, e.g., subsequent to operation 250 in method 200.

At operation 320, the processor performs the read operation while operating the memory controller and the memory die at an initial frequency. This initial frequency can be based on device specification data available from factory tests on similar memory die. This step can be similar or identical to operation 220 in method 200.

At operation 330, the processor determines whether an error event is detected. An error event can be detected when the error correcting code fails to correct error in data, i.e. when UECC occurs. The UECC can be related to tight timing margin of memory dies.

If the no uncorrectable error event is detected at operation 330, then at operation 380, the processor determines that the initial frequency should be maintained for the controller and the memory die.

On the other hand, responsive to detecting an uncorrectable error event at operation 330, the processor proceeds to operation 340, and sets an error threshold criterion for repeating the read operation one or more times. The number of repetition can be set by a counter.

At operation 350, the processor adjusts operating frequency of at least one of the memory controller or the memory die to a frequency that is different from the initial frequency. For example, the processor can slow down the controller frequency while keeping the die frequency at the initial level, or, increase the die frequency while keeping the controller frequency at the initial level. In certain other embodiments, both the controller frequency and the die frequency are changed with respect to the initial frequency. This frequency adjustment is done to re-perform the failure event in order to conform the operating frequency of the die and/or controller to a current wear level of the memory device. For example, with repeated usage, after a certain time, a die that used to have adequate timing margin in the beginning, can be degrades to an extent where timing margin decreases and probability of read failure increases.

At operation 350, the processor determines whether a second error threshold criterion is satisfied. Note that satisfying the error threshold criterion can be occurrence of an UECC event, as in method 200.

If the error threshold criterion is not satisfied at operation 360, then at operation 380, the processor determines that the initial frequency should be maintained for the controller and the memory die.

On the other hand, responsive to determining that the error threshold criterion is satisfied (e.g., UECC persists), at operation 370, the processor determines that the operating frequency of the memory controller and/or memory die needs to be semi-permanently or permanently updated to conform with the current level of wearing. This way, the adaptive frequency control component 113 of FIG. 1 can periodically control the operating frequency over the lifespan of the drive, resulting in extended life of the drive.

Figure 4:
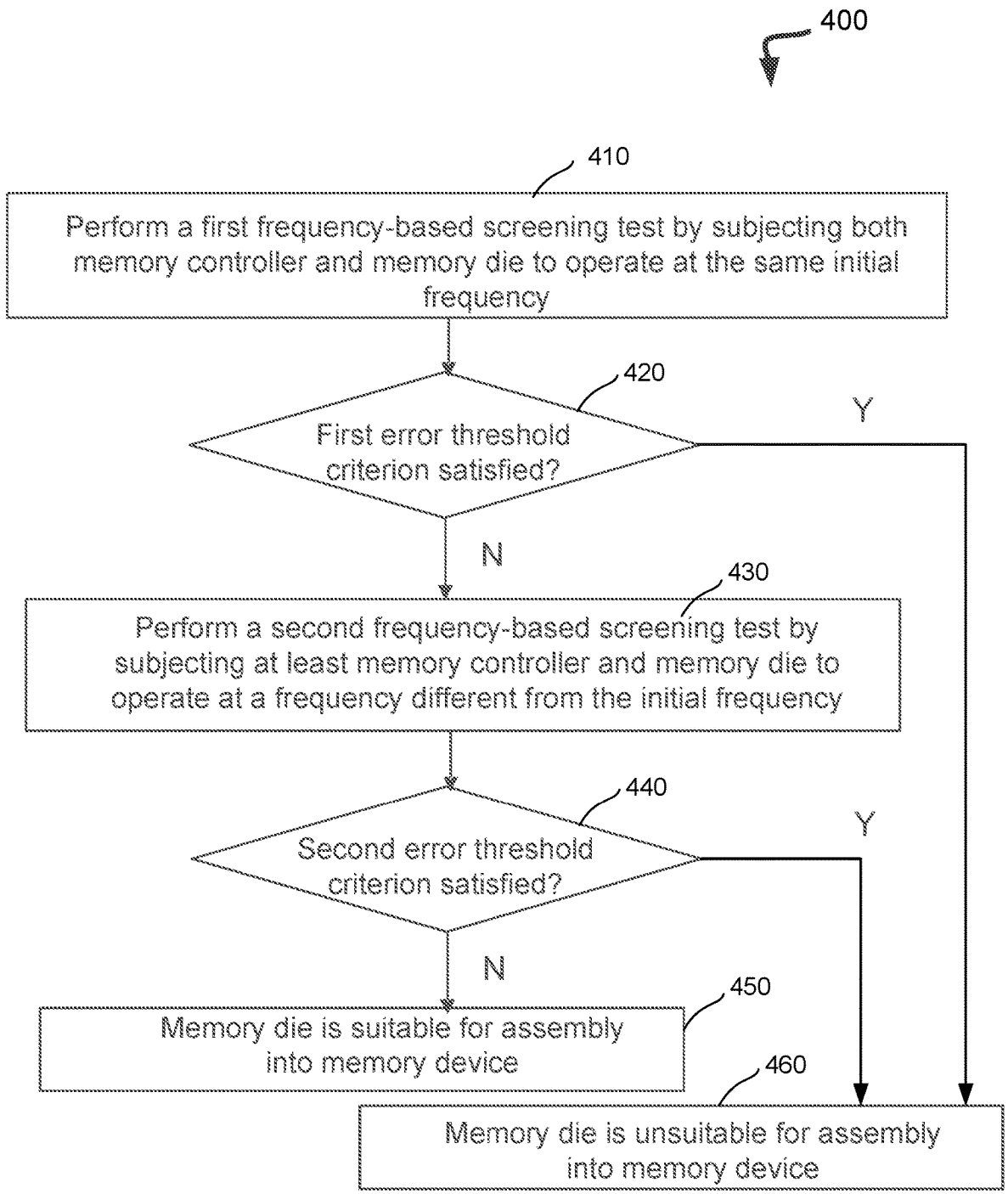
FIG. 4 illustrates a flow diagram of an example method of pre-screening dies with poor timing margin performance before assembling the dies into a memory device, in accordance with some embodiments of the present disclosure.

FIG. 4 is a flow diagram of an example method 400 of pre-screening dies with poor timing margin performance before assembling the dies into a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 can be performed by adaptive frequency control component 113 of FIG. 1 that is part of a test setup in a factory before assembling the die into a memory device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a test setup performs a first frequency-based screening test by subjecting both the memory controller and the memory die to operate simultaneously at a same initial frequency. At operation 420, a processor determines whether a first error rate associated with the memory die satisfies a predetermined first error threshold criterion. The criterion can be similar to what is described in method 200, e.g. occurrence of UECC. The error threshold criterion can be specific to a predetermined reliability rating for the memory sub-system.

If the first error threshold criterion is satisfied at operation 420, then at operation 460, the processor determines that the memory die is unsuitable for assembly into a memory device with a certain reliability rating. Thus the memory dies with poor timing margin (tied to UECC) are discarded to ensure high quality assembled drive.

On the other hand, responsive to determining that the first error threshold criterion in not satisfied, at operation 430 the test setup performs a second frequency-based screening test by subjecting at least one of the memory controller or the memory die to operate at a frequency that is different from the initial frequency. Performing a second frequency-based screening test can mean subjecting the memory controller to operate at a frequency that is higher than the initial frequency, or, subjecting the memory die to operate at a frequency that is lower than the initial frequency.

At operation 440, the processor determines whether a second error rate associated with the memory die satisfies a predetermined second error threshold criterion after the second frequency-based screening test. The criterion can be similar to what is described in method 200, e.g. occurrence of UECC. The error threshold criterion can be specific to a predetermined reliability rating for the memory sub-system.

If the second error threshold criterion is satisfied at operation 420, then at operation 460, the processor determines that the memory die is unsuitable for assembly into a memory device with a certain reliability rating. Thus the memory dies with poor timing margin (tied to UECC) are discarded to ensure high quality assembled drive.

On the other hand, responsive to determining that the second error threshold criterion in not satisfied, at operation 450, the processor determines that the memory die is suitable for being assembled into a memory device. As mentioned above, since the drive is likely to experience fluctuation in signal and power level during its operating life, which causes timing margin loss, it is beneficial to select superior dies with higher timing margin at the beginning, so that even if the timing margin degrades somewhat during the operating lifetime, the reliability rating of the assembled drive is nor negatively impacted.

Figure 5:
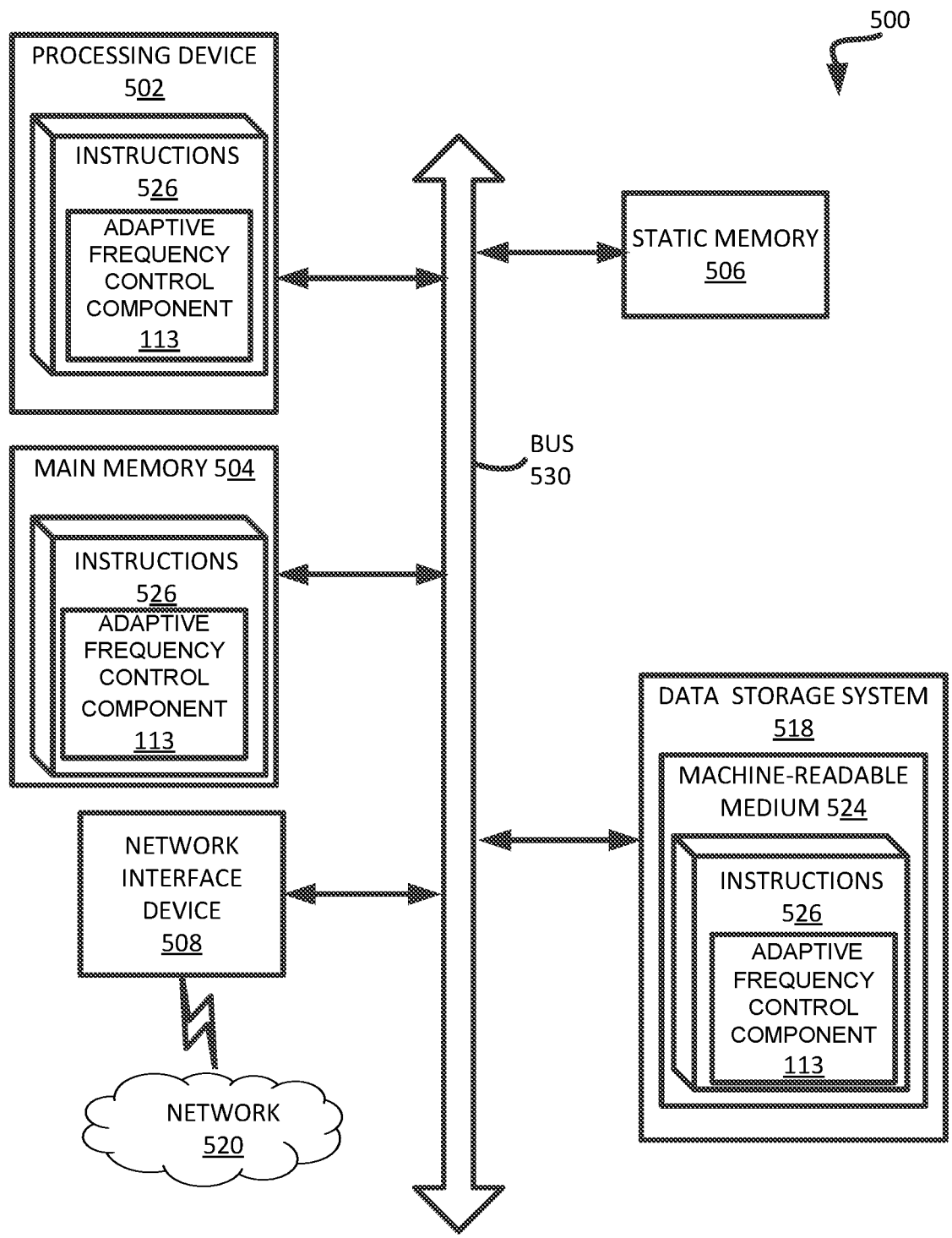
FIG. 5 illustrates a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. For example, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adaptive frequency control component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520. The data storage device 518 can include a machine-readable storage medium 524 (also known as a computer-readable medium) on which is stored one or more sets of instructions or software 526 embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage device 518, and/or main memory 504 can correspond to the memory sub-system 110 of FIG. 1.

In one implementation, the instructions 526 include instructions to implement functionality corresponding to a specific component (e.g., perform adaptive frequency control by frequency control component 113 of FIG. 1). While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving" or "servicing" or "issuing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
    receiving a command to read specific data stored at a memory die;
    performing a read operation while operating both a memory controller and the memory die simultaneously at a first frequency;
    determining whether a first error rate associated with the memory die satisfies a first error threshold criterion;
    responsive to determining that the first error rate satisfies the first error threshold criterion, repeating the read operation while operating at least one of the memory controller or the memory die at a second frequency that is different from the first frequency;
    determining whether a second error rate associated with the memory die satisfies a second error threshold criterion;
    responsive to determining that the second error rate satisfies the second error threshold criterion, repeating the read operation for a predetermined number of times before determining that the read operation has failed, wherein satisfying at least one of the first error threshold criterion or the second error threshold criterion comprises an error becoming uncorrectable by error correcting code; and
    responsive to determining that the second error rate does not satisfy the second error threshold criterion, determining that the read operation is successful.

2. The method of claim 1, wherein repeating the read operation comprises:
    operating the memory controller at a second frequency that is lower than the first frequency.

3. The method of claim 1, wherein repeating the read operation comprises:
    operating the memory die at a second frequency that is higher than the first frequency.

4. The method of claim 1, further comprising:
    responsive to determining that the first error rate does not satisfy the first error threshold criterion, determining that the read operation is successful.

5. The method of claim 1, further comprising: responsive to determining that the read operation has failed, initiating a data recovery process that comprises:
 issuing a new command to read specific data stored at the memory die;
 performing a data recovery read operation comprising a plurality of cycles while operating both a memory controller and the memory die simultaneously at an initial operating frequency;
 detecting an occurrence of an error event;
 setting an error threshold criterion;
 repeating the data recovery read operation while adjusting, with respect to the initial operating frequency, the operating frequency of at least one of the memory controller and the memory die during each cycle of the plurality of cycles of the read operation;
 during each cycle of the plurality of cycles of the data recovery read operation, determining whether the error threshold criterion is satisfied at an adjusted value of a current operating frequency; and
 responsive the determining that the error threshold criterion is satisfied, updating the operating frequency of at least one of the memory controller or the memory die to the adjusted value of the current operating frequency.

6. The method of claim 5, wherein adjusting the operating frequency during data recovery comprises:
 incrementing the operating frequency of the memory die in predetermined steps for each read cycle.

7. The method of claim 5, wherein adjusting the operating frequency comprises:
 decreasing the operating frequency of the memory controller in predetermined steps for each read cycle.

8. The method of claim 5, further comprising:
 responsive to detecting the occurrence of the error event, setting a counter to repeat the data recovery read operation for a predetermined maximum number of times; and
 responsive to determining that the error threshold criterion is not satisfied after the data recovery read operation is repeated for the predetermined number of times set in the counter, maintaining the initial operating frequency.

9. The method of claim 5, wherein the error event comprises an uncorrectable error correcting code (UECC) event.

10. The method of claim 5, wherein an amount by which the operating frequency of at least one of the memory controller and the memory die is adjusted is based on a current state of wear of the memory die within an operating lifetime of the memory die.

11. The method of claim 10, wherein the operating frequency of at least one of the memory controller and the memory die is adjusted periodically during a maintenance process for a memory device that includes the memory die.

12. A system comprising:
 a plurality of memory dies; and
 a processing device in a memory controller, operatively coupled to the plurality of memory dies, to perform screening operations for each of the plurality of memory dies, the operations comprising:
  receiving a command to read specific data stored at a memory die;
  performing a read operation while operating both a memory controller and the memory die simultaneously at a first frequency;
  determining whether a first error rate associated with the memory die satisfies a first error threshold criterion;
  responsive to determining that the first error rate satisfies the first error threshold criterion, repeating the read operation while operating at least one of the memory controller or the memory die at a second frequency that is different from the first frequency;
  determining whether a second error rate associated with the memory die satisfies a second error threshold criterion;
  responsive to determining that the second error rate satisfies the second error threshold criterion, repeating the read operation for a predetermined number of times before determining that the read operation has failed, wherein satisfying at least one of the first error threshold criterion or the second error threshold criterion comprises an error becoming uncorrectable by error correcting code; and
  responsive to determining that the second error rate does not satisfy the second error threshold criterion, determining that the read operation is successful.

13. The system of claim 12, wherein repeating the read operation comprises:
 operating the memory controller at a second frequency that is lower than the first frequency.

14. The system of claim 12, wherein repeating the read operation comprises:
 operating the memory die at a second frequency that is higher than the first frequency.

15. The system of claim 12, the operations performed by the processing device further comprising:
 responsive to determining that the first error rate does not satisfy the first error threshold criterion, determining that the read operation is successful.

* * * * *